(12) United States Patent
Thomas

(10) Patent No.: US 7,193,900 B2
(45) Date of Patent: Mar. 20, 2007

(54) CACT-TG (CATT) LOW VOLTAGE NVM CELLS

(76) Inventor: Mammen Thomas, 1081 Corvette Dr., San Jose, CA (US) 95129-2906

( * ) Notice: Subject to any disclaimer, the term of this patent is extended or adjusted under 35 U.S.C. 154(b) by 35 days.

(21) Appl. No.: 11/037,742

(22) Filed: Jan. 18, 2005

(65) Prior Publication Data
US 2006/0158930 A1    Jul. 20, 2006

(51) Int. Cl.
*G11C 11/34* (2006.01)
(52) U.S. Cl. .............................. 365/185.29; 365/185.24
(58) Field of Classification Search ........... 365/185.29, 365/185.24
See application file for complete search history.

(56) References Cited
U.S. PATENT DOCUMENTS
5,675,161 A * 10/1997 Thomas ...................... 257/316
* cited by examiner Primary Examiner—Michael Tran

(57) ABSTRACT

Described herein are the methods the CACT and TG Non-volatile program erase methods, for programming and erasing NVM cells. This combination allows use of low voltage methods for program, and erases. The typical cell described uses the "Channel Accelerated Carrier Tunneling (CACT) method for programming memories" for accumulating one type of carriers in the floating gate, and another method, the Tunnel Gun (TG) method, for accumulating the other type of carriers in the floating gate of the cells. These methods use low applied voltages to program and erase the Non-Volatile Memory cell. The proposed CATT (CAcT-Tg) cells by elimination of high voltage requirements are scalable with technology and easily manufacturable using current processes technologies. These cells also have multi-bit storage capability as the program erase methods used are self-limiting in character. Another advantage is the increase in reliability of Cells using this method due to reduced voltage stress.

14 Claims, 8 Drawing Sheets

Typical (approximate) Operating Voltage table for the preferred CATT1 Cell Array

| Terminal | Erase | | Program | | Read |
|---|---|---|---|---|---|
| | Selected | Unselected | Selected | Unselected | 0V |
| Source | 0V | 0V | 0V | 0V | 0V |
| Drain | 0V | 0V | Vdd | 0V | Vdd |
| Select | 0V | 0V | 0.4-1.0V | 0V | Vdd |
| Injector | 4-7V | 0V | 3-7V* | 0V | 0V |
| Collector Grid | 1-2V | 0V | 3-7V* | 0V | 0V |
| Notes | All cells on the control gate are erased to be conducting | | Selective shut-off of cells on the select line with Vdd on bit line | | |
| * The two terminals together act as control gate during program | | | | | |

Prior Art
Flash Cell layout

Prior Art
Flash Cell Cross section (xx)

Prior Art
EEPROM Layout

Prior Art
EEPROM Cell Cross section (xx)

CATT1 (CAct- Tg1) Cell

A typical example of the disclosed structure using the two methods.

CATT1 (CAct- Tg1) Cell "X-X Cross section"

A cross section of the typical example of the disclosed structure

CATT1 (CAct- Tg1) Cell "Y-Y Cross section"

A second cross section of the typical example of the disclosed structure

CATT2 (CAct- Tg2) Cell

Another typical embodiment example of the disclosed structure using the two methods.

CATT2 (CAct- Tg2) Cell "X-X Cross section"

A cross section of the second typical example of the disclosed structure

Fig.10

Typical (approximate) Operating Voltage table for the preferred CATT1 Cell Array

| Terminal | Erase | | Program | | Read |
|---|---|---|---|---|---|
| | Selected | Unselected | Selected | Unselected | 0V |
| Source | 0V | 0V | 0V | 0V | 0V |
| Drain | 0V | 0V | Vdd | 0V | Vdd |
| Select | 0V | 0V | 0.4-1.0V | 0V | Vdd |
| Injector | 4-7V | 0V | 3-7V* | 0V | 0V |
| Collector Grid | 1-2V | 0V | 3-7V* | 0V | 0V |
| Notes | All cells on the control gate are erased to be conducting | | Selective shut-off of cells on the select line with Vdd on bit line | | |
| * The two terminals together act as control gate during program | | | | | |

CACT-TG (CATT) LOW VOLTAGE NVM CELLS

FIELD OF INVENTION

This invention relates to the structure and method of Low Voltage Programmable/Erasable Non-Volatile Memory cell technology for embedded and mass storage applications and products.

PRIOR ART

Electrically Alterable Read Only Memories (EAROM) of prior art falls into two main categories today: The EEPROMs and the Flash memories. All these memories use one or a combination of two different types of program methods. They are typically the (CHE) Channel Hot electron, and FN-Tunneling methods. The use of the FN-tunneling method is the most common for erase while FN tunneling or CHE method is used for program. The CHE method requires high currents and medium voltages to program while the FN-tunneling method used for erase make it necessary to have high voltages present in the circuit. Both these methods come with the associated problems of reliability and inability to scale the cells as the technology scales.

A typical Flash cell layout is shown in FIG. 1 and the cross section of this cell is shown in FIG. 2. The flash memory technology and products are capable of page, sector, block or bulk erase, but they do not provide byte alterability, and are not suitable for the applications where the byte alterability of the memory cells is an essential requirement. The flash is the most prevalent memory of this time. It allows the possibility of page, sector, block or chip erase at one time, using FN-tunneling followed by program using either Channel Hot electron method, or FN tunneling method. The cell size is smaller than the EEPROM and hence this type of cell is mostly used in memories used in large data stores. The term flash arises from its ability to erase the selected group of cells in a page, sector, block or the whole chip in a flash and then program the devices in a byte or page fashion.

A typical flash cell in FIG. 1 comprises of a substrate doped with a dopant of one type, typically P type (9). Source (1) and drain (2) diffusions are incorporated into the substrate separated by the channel (14) of required length. These diffusions are of a dopant of opposite type, namely n-type. In a typical flash cell second lower dose diffusion, namely tunnel diffusion (5) is incorporated over the primary source diffusion using a dopant of the same type but with a lower dose, to facilitate high voltage and tunneling. A thin tunnel oxide (10) is grown on the channel region over which is deposited a doped polysilicon layer (6), typically doped with n-type dopant. An oxide protective layer on the sidewalls of the polysilicon and a high coupling ONO layer (12) on the top isolate and protect the polysilicon layer, which then form the floating gate of the device. A second layer of polysilicon (7) over the top of the ONO protection layer form the control gate of the device. In a typical flash cell the drain is contacted by a metal line at contact (3) and the source is contacted through the diffusion.

The cell shown is written by CHE method where the cells are operated in high saturation. For this a voltage is applied to the drain (2) with the source (1) at ground and a medium high voltage is applied to the control gate (7), which is coupled down to the floating gate (6) across the ONO insulator (12). The channel (14) is turned on under the thin oxide (10) with the floating gate on top. This channel starts to pinches off in saturation and a high field exists at the edge of the drain junction. Impact ionization occurs at this region and hot electrons and hole pairs are formed. A high voltage is applied to the gate such that holes get repelled by the voltage but electrons will be attracted to the gate. Some (a very low %) of these electrons will possess the right velocity and energy when combined with the voltage on the gate to overcome the barrier and get accumulated in the floating gate electrode. This type of programming has problems of high currents and some what high voltages. Hole currents are a major issue as these have to be removed through the substrate.

The flash cell is erased by FN-Tunneling. This is done through the area where the tunnel diffusion (5) overlaps the gate/tunnel oxide. A high potential difference is applied across the source diffusion (1) and the floating gate (6) and this causes tunneling to take place from the floating gate through the oxide into the tunnel diffusion junction. The high voltage can be applied by raising the source to a high voltage while keeping the control gate (7) at ground, where by the floating gate which is coupled to the control gate through the ONO layer (12) will remain at a low voltage producing a high tunnel potential across the tunnel oxide in the tunnel diffusion region. Another method is by use of a medium high positive voltage to the source while applying a negative voltage to the control gate to get the required potential difference across the tunnel oxide.

A typical prior art N-Channel EEPROM cell layout is shown in FIG. 3 and the cross section for the cell is shown in FIG. 4. The cell is made up as follows: A floating gate transistor comprising of a Floating gate oxide (13) grown on silicon substrate, typically having a P-type dopant incorporated, P-well (9), and a tunnel oxide (10) grown over a tunnel diffusion (5), typically having an N-type dopant incorporated, adjacent to the gate oxide region. A polysilicon layer is deposited, and patterned over the Floating gate oxide (13) and tunnel oxide regions (10) to form floating gate (6). A Source (1) doped N-type is on the other side of the floating gate transistor. Another layer of polysilicon, the control gate (7) is deposited, and patterned on top of the floating gate but separated from it by an insulating dielectric film known as Inter Poly dielectric (12), typically an Oxide-Nitride-Oxide (ONO) sandwich. A select transistor is also implemented using a layer of Poly silicon forming a select gate (8) over a select gate oxide (11) grown on P-doped silicon (9). A connect diffusion (4), doped N-type is used to connect the tunnel diffusion (5) to the channel (15) of the select transistor. A diffused drain (2), N-doped, with a contact (3) is used to apply voltages to the drain region of the cell during operation. The drain region (2) can be isolated or connected to the connect diffusion (4) and the tunnel diffusion (5) through the channel region of the select gate (15) by turning off or turning on the select transistor. For an N channel cell this voltage has to be a positive voltage typically $V_{dd}$ for turning the transistor on and ground for turning the transistor off.

The EEPROM cell is programmed (Electron accumulation in the floating gate, (6)) by application of a high voltage to the Control Gate (7), which gets capacitively coupled to the floating gate (6) across the Inter Poly dielectric (12). A positive voltage is applied to the select gate (8) to turn the select transistor channel (15) on and a ground potential is applied to the drain (2). This voltage gets passed to the tunnel diffusion (5) through the channel of the select transistor and the connect diffusion (4), to allow a positive potential to be applied across the tunnel oxide (10), due to the coupled down high voltage on the floating gate. If this potential is high enough, typically about 10 MV/cm, electrons that exist in the tunnel diffusion gets through the tunnel oxide by Fowler-Nordheim tunneling to charge the floating gate negative. This operation is known as program operation, and the negative charge on the floating gate makes the Threshold voltage of the Floating gate transistor much higher. This High threshold of the Floating gate transistor is known as Program threshold.

The EEPROM cell is Erased (electrons removed from the floating gate) by applying ground potential to the Control Gate (7), and a high positive voltage to the drain (2) of the memory Cell to be erased through the contact (3), with a high voltage applied to select gate (8) to turn on the select transistor channel (15) on and pass the high voltage to the Connect diffusion (4) and to the tunnel diffusion (5). This causes the high voltage applied to the drain to pass on to the tunnel diffusion under the tunnel oxide (10). The ground potential applied to the control gate (7) gets coupled to the floating gate (6) through capacitive coupling across the dielectric (12), separating the Control gate from the floating gate. Hence a high potential difference is established between the tunnel diffusion (5) and the floating gate (6) across the tunnel oxide. If this potential is sufficient (approx. 10 MV/cm) to cause tunneling, electrons from the floating gate tunnel out to the tunnel diffusion and charge the floating gate positive. Since the tunneling is controlled by the drain voltage applied, this can be controlled by the data input of the memory. If the high voltage is applied to the drain (2) of the cell the cell will erase and if there is no high voltage applied to the drain (2) of the cell that cell will not erase. This Erase operation lowers the threshold voltage of the Floating Gate transistor to a negative value making it a depletion device. Typically the program threshold voltage of an EEPROM Floating gate transistor is around 2 to 4 volts and the Erase threshold voltage of an EEPROM Floating Gate transistor is −2 to −4 volts.

The scaling of the tunnel oxide below 70 Å has been found to introduce reliability issues in EAROMs (EEPROM and Flash). Typical tunnel oxide thickness lies between 70 Å and 90 Å in most EAROM applications where high reliability is crucial. This problem of oxide scaling has limited the use of reduced voltage required to tunnel. (Voltage needed to tunnel effectively is approximately 10 MV/cm across the tunnel oxide). Since the coupling ratios from the Control gate to floating gate for small cells is of the order of 60% the high voltage to be applied to the cells vary from 12 to 20V depending on the exact coupling and thickness of the tunnel oxide. This voltage has to be handled by the junctions and the gates of the memory cell and the high voltage devices distributing this voltage to the memory cells. These high voltages require large spacing of devices, longer channel lengths and thick gate oxides causing the cell sizes, the isolation and the high voltage transistor sizes to be large.

Some of the disadvantages of the prior art cells discussed above include:

1. High Voltage or high current need to achieve program and erase.
2. Need for high voltage transistors in the circuit limiting the speed.
3. Inability to scale the junctions and isolation in the array due to the high voltage requirements
4. Complexity of Process and specialized processing due to the High Voltage requirements
5. Difficult drain engineering
6. Need to prevent the cells in the array going into depletion or turn on due the need to prevent unselected cell leakage current from impacting the sense
7. The lack of limiting feature to program and erase to allow easy implementation of multi level programming of cells without a substantial component of extra control circuitry.
8. High power dissipation during program and erase operations due to the dissipation in oscillators and pump circuitry to generate the necessary high voltages.
9. Comparatively slow program erase operation.

What is proposed is:

Two novel methods of program/erase have been proposed and have been patented by the inventor and John Caywood respectively. What is proposed in this disclosure is the combining of the two novel methods to eliminate the disadvantages of the prior art and the proposed cells using these methods as per the patents enumerated earlier in the disclosure.

The first is the CACT method of programming/erasing disclosed in patent U.S. Pat. No. 5,519,653, and the associated structure implementations, the "Double Poly trenched Channel Accelerated tunneling electron cell, for memory applications U.S. Pat. No. 5,506,431 and the Channel Accelerated Tunneling Electron cells disclosed in patent U.S. Pat. No. 5,675,161. These cells use the carriers in the channel, accelerated towards a barrier insulator where they come under the influence of the accelerating potential on a floating gate over laying the barrier. The carriers when they reach the depletion region under the floating gate, formed due to the potential on the floating gate, are already at saturation velocities or velocities close to saturation, and these get further accelerated to saturation velocities in the floating gate depletion field, and is hot enough to overcome the barrier height of the oxide and charge the floating gate. Alternately, if the carriers acquire enough energy, the effect of the barrier is reduced, electron velocity assisted tunneling, using the kinetic energy of the electron to reduce the need for high tunnel voltage, can also take place to charge the floating gate. Both these effects have been categorized as "Channel Accelerated Carrier Tunneling" as it uses the velocity of the carriers in the channel as part of the energy for the operation. As the floating gate charges, it acquires carriers having the opposing charge to the potential on the floating gate. This reduces the accelerating field on the carriers in the channel depletion region under the floating gate causing charging to reduce and finally stop. At this point no further accumulation of carriers in the floating gate occur. The type of carriers can be either electrons or holes in these applications. Some of the structures that can be implemented using the method have been patented under the referenced patents. A large number of other implementations will be possible with this method, including ones with the floating gate implemented inside the trench on the side wall and the select gate out side, and will be known to those practicing the art. The prior art cells using this method alone need to be erased by FN-Tunneling or some other means needing high voltage application. This erase operation needing high voltages even though the program is fast and with application of low voltage has been a limiting factor in the implementation of these cells. The use of high voltages make these cells difficult to scale effectively as the prior art cells in use today. Due to the high voltage limitations mentioned these cells have not become mainstream prior art cells.

A second method proposed to be combined with the first is for injecting and accumulating charge in the floating gate of a non-traditional non-volatile memory cell is the use of a structure similar to MIM diode, where the collector electrode is thinned down sufficiently to act as a sieve or grid. This use of a tunneling injector and collector grid operating as a Tunnel-Gun or "Tun-Gun" described in "Method and apparatus for injecting charge into the floating gate of a non-volatile memory cell" issued patents U.S. Pat. No. 6,534,816, U.S. Pat. No. 6,479,863, and U.S. Pat. No. 6,384,451. These cells use an injector layer that is metallic, which has relatively free carriers. These carriers are provided enough potential energy to overcome a thin barrier material (typically Silicon dioxide or Aluminum oxide) separating it from a conducting grid collector electrode. The thickness of the grid electrode is adjusted such that a portion of the carriers with the high-energy pass through and re-enter a second barrier layer. This layer is the one that protects the floating gate from loosing data. If the potential across this barrier is in a direction to attract the carriers to the floating gate, it will get charged. If it is in the opposite direction these carriers will fall back into the grid electrode and get collected by it. Cells shown using this method have been proposed that have both the program and erase by Tun-Gun method, thereby reducing the voltage seen by the cells. Here again the Tun-Gun can be made to inject electrons or holes based on the type of injector used and the voltages applied and hence can be used in combination with the CACT method to implement a P channel or and N-channel device. The problem is that these cells are too complex to manufacture with a number of additional deposition, etch and masking steps which increases the cost of the product and affect the yield. The difficulty in manufacture and the resultant lower yield has kept the cells based on this technology from being mainstream prior art cells.

Since the CACT and the Tun-Gun methods allow the injection of electrons or holes based on the device type and the choice of injector, the combination allows the implementation of Non-Volatile memory devices of N-channel or and P-Channel type. In addition the capability to program or erase using either of the technologies also allow versatility of design. The self-limiting feature of the program and erase methods also enable the use of these technologies in multi-level cell implementation using the combined technologies.

The Objects and Advantages of the New Structure Combining the Two Novel Methods of Program/Erase are:

What is proposed is the use of the two novel methods one for programming and the other for erase in the CACT-TG method and cells, such that we can eliminate the disadvantages mentioned in the prior art and the cells discussed in the patents referenced that use the methods discussed in them Some advantages of the current method and implementation include:
1. Reduced the overall voltages needed to program and erase
2. Easier Drain engineering for embedded operation
3. Reduced Process complexity due to low voltage operation
4. High speed program and erase operation.
5. Ability to inject either types of carriers, electrons or holes, into the floating storage node.
6. The ability for injecting either electrons or holes make either of the discussed methods suitable for write or erase in a non-volatile memory.
7. Memories can be implemented as either N-channel or P-channel cells.
8. The lower voltages in the system allow scaling in the horizontal and vertical directions.
9. Process steps are those currently in use and do not need to be developed uniquely for the cell.
10. Easily Integratable.
11. Reduced power dissipation.
12. The cells can be made small and can be close to the size of typical DRAM cells, enabling large arrays to be implemented.
13. Reduced peripheral circuitry as the cells can go into depletion during use.
14. Self-limiting charging allowing multilevel cells to be implemented effectively.
15. Program erase levels are limited by applied voltage and sense margins requirements can be effectively established in a multi-level cell using these methods.

Figure 1:
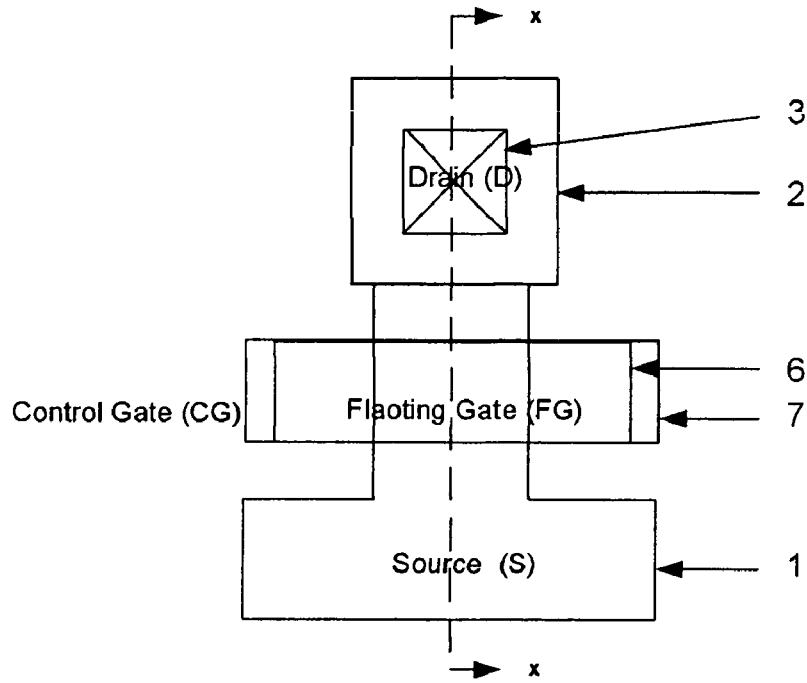
FIG. 1—Is a layout implementation of a prior art Flash cell.
Figure 2:
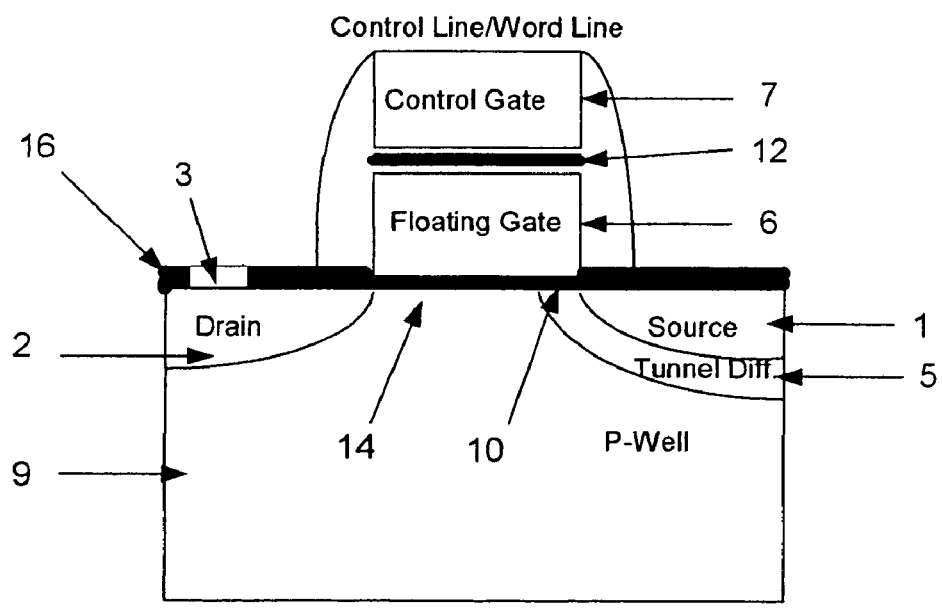
FIG. 2—Is a typical cross section of the Flash cell of FIG. 1.
Figure 3:
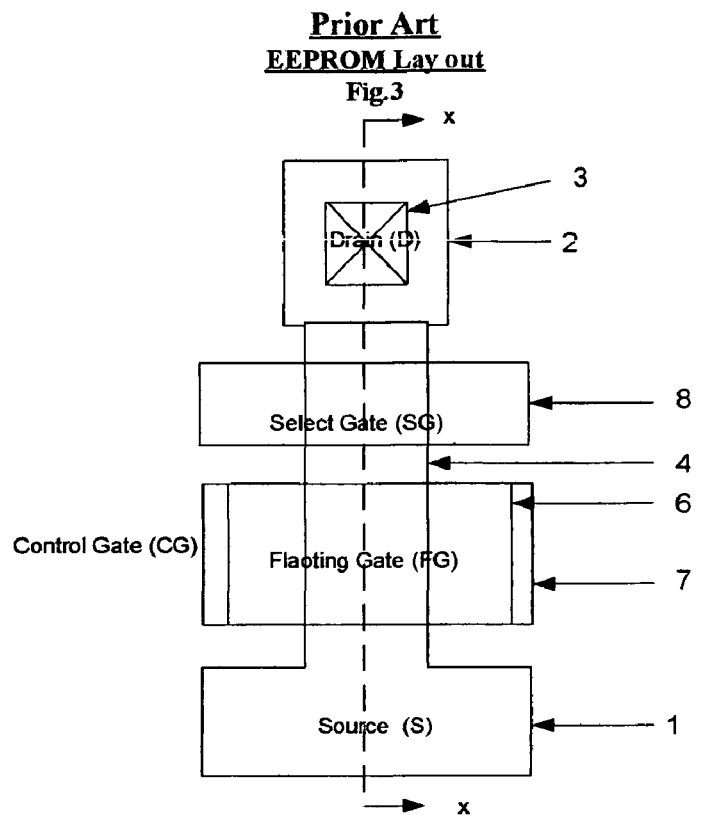
FIG. 3—Is a layout implementation of a prior art EEPROM Cell.
Figure 4:
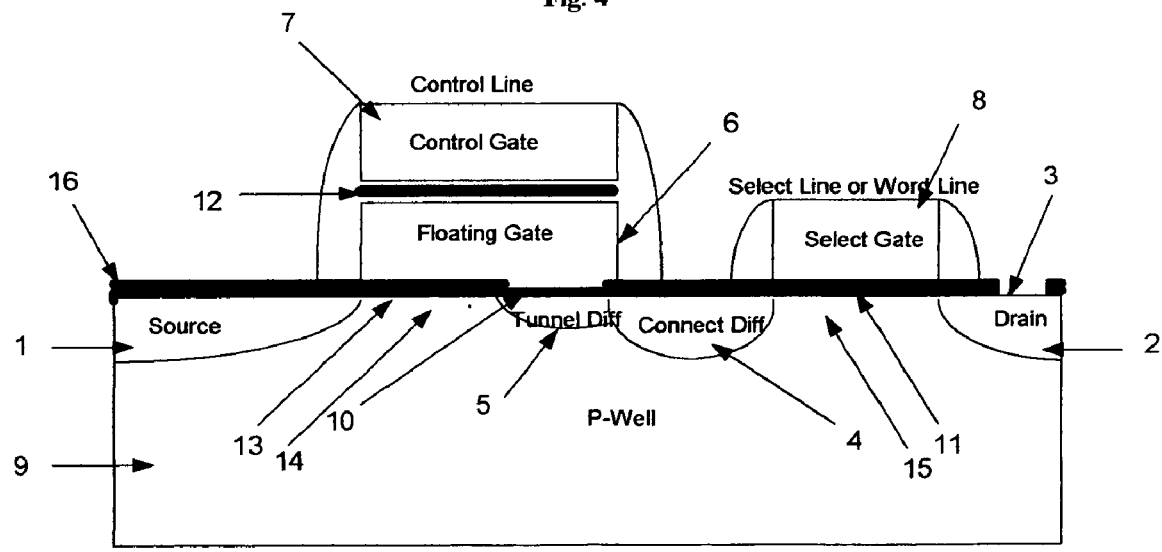
FIG. 4—Is a typical cross section of the EEPROM cell of FIG. 3.

EXPLANAION OF NUMBERING AND LETTERING IN THE FIGURES FOR TYPICAL IMPLEMENTATION OF THE TECHNOLOGY

Prior Art FIG. 1, FIG. 2, FIG. 3 and FIG. 4
1. N Source diffusion (S)
2. N Drain diffusion (D)
3. Drain contact
4. N Connect (connecting) diffusion
5. Tunnel (tunneling) diffusion
6. Floating gate (Poly Silicon) (FG)
7. Control Gate (Poly Silicon) (CG)
8. Select Gate (Poly Silicon) (SG)
9. P-Well
10. Tunnel oxide (typically 80 to 100 Å)
11. Select gate Oxide
12. Inter Poly Dielectric (typically ONO)
13. Floating gate oxide
14. Floating Gate channel region or memory transistor channel region
15. Select Gate channel region or Select Transistor channel region
16. SiO2 protection on Drain and/or Source diffusion
17. N-Well CATT Cell in FIG. 5, FIG. 6, FIG. 7, FIG. 8, and FIG. 9;
1. Select Gate poly in trench
   1a. Trench side wall/select gate oxide 1b. Channel region of select device
1c. Discontinuity in channel where channel accelerated or velocity enhanced tunneling happens
2. Select gate poly (row select)
3. Floating gate polysilicon
3a. Gate Oxide
3b. Channel region under the floating gate oxide
4. Source/Drain Region
5. Contact fill
6. Collector Grid
6a. Barrier Material
7. Injector
8. Well in silicon doped with a dopant having the opposing polarity as the diffusion
9. Metal connection to the contact fill (bit line).
10. Buried layer, or a well or substrate doped with material similar to contact diffusion forming a second terminal for the integrated channel (1b+3c)
11. Field Oxide
11a. STI oxide isolation
12. Select gate poly isolation Oxide
12a. Charge retention oxide
13. Inter layer dielectric
14. Unit cell for the CATT implementation

DESCRIPTION OF THE INVENTION

Figure 5:
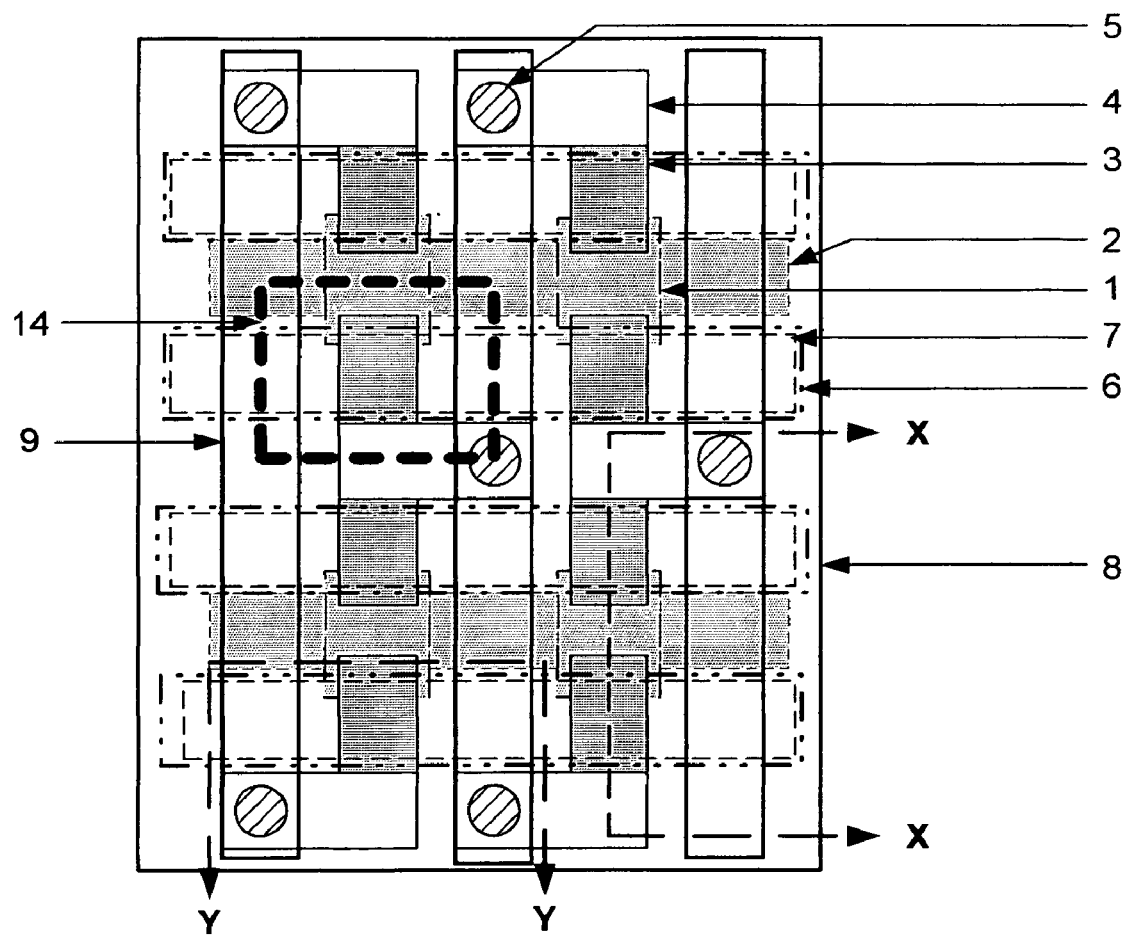
FIG. 5—Is a layout of one implementation of the CATT1 (CACT-TG1) cell.
Figure 6:
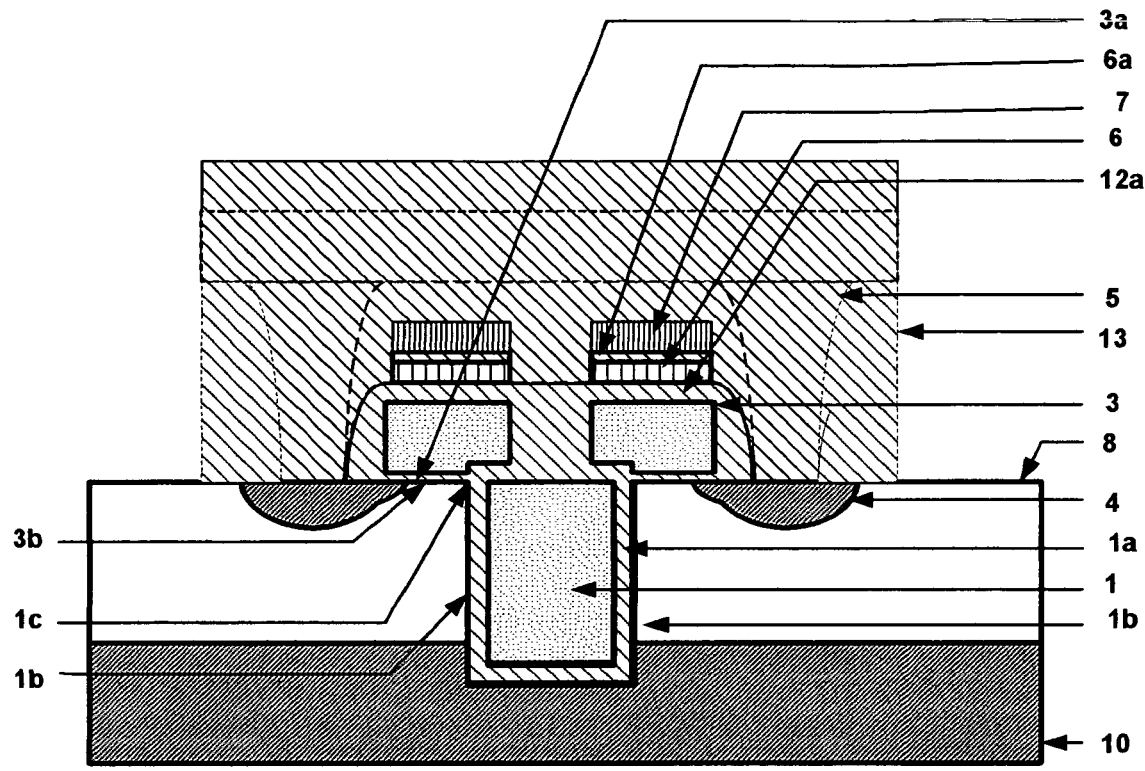
FIG. 6—Is a X—X cross section of the CATT1 cell in FIG. 5
FIG. 7—Is a Y—Y cross section of the CATT (CATT1 and CATT2) cells in FIG. 5 and 8
FIG. 8—Is a cross section of a second implementation of the CATT (CATT2) cell.
Figure 7:
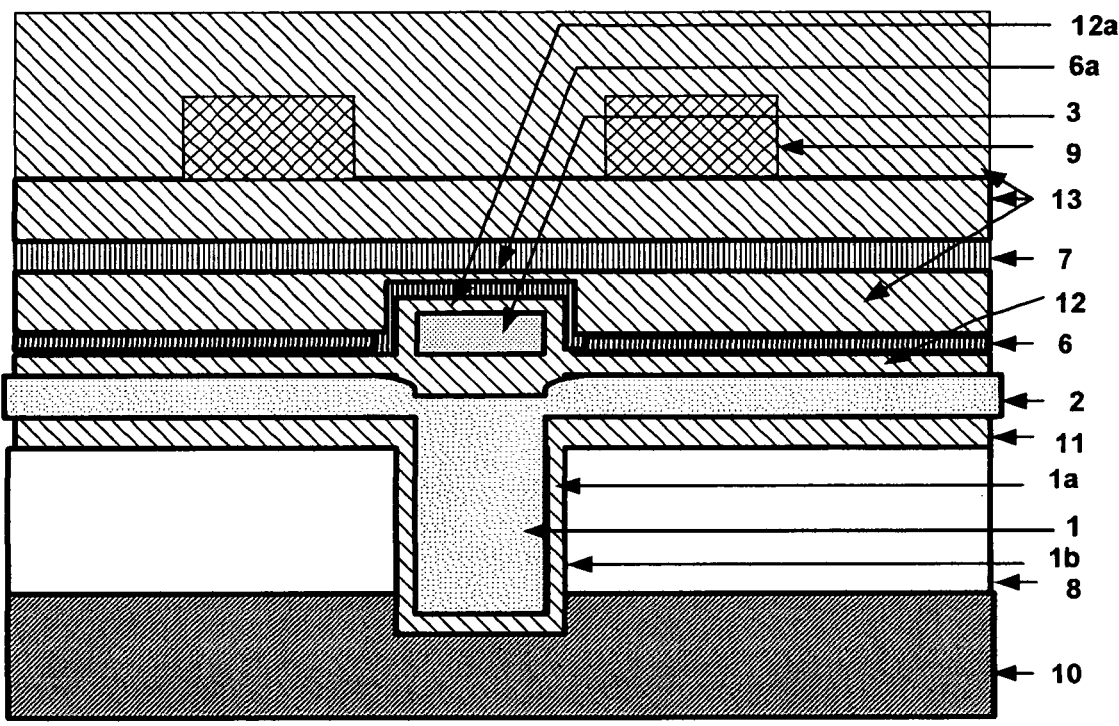
Figure 8:
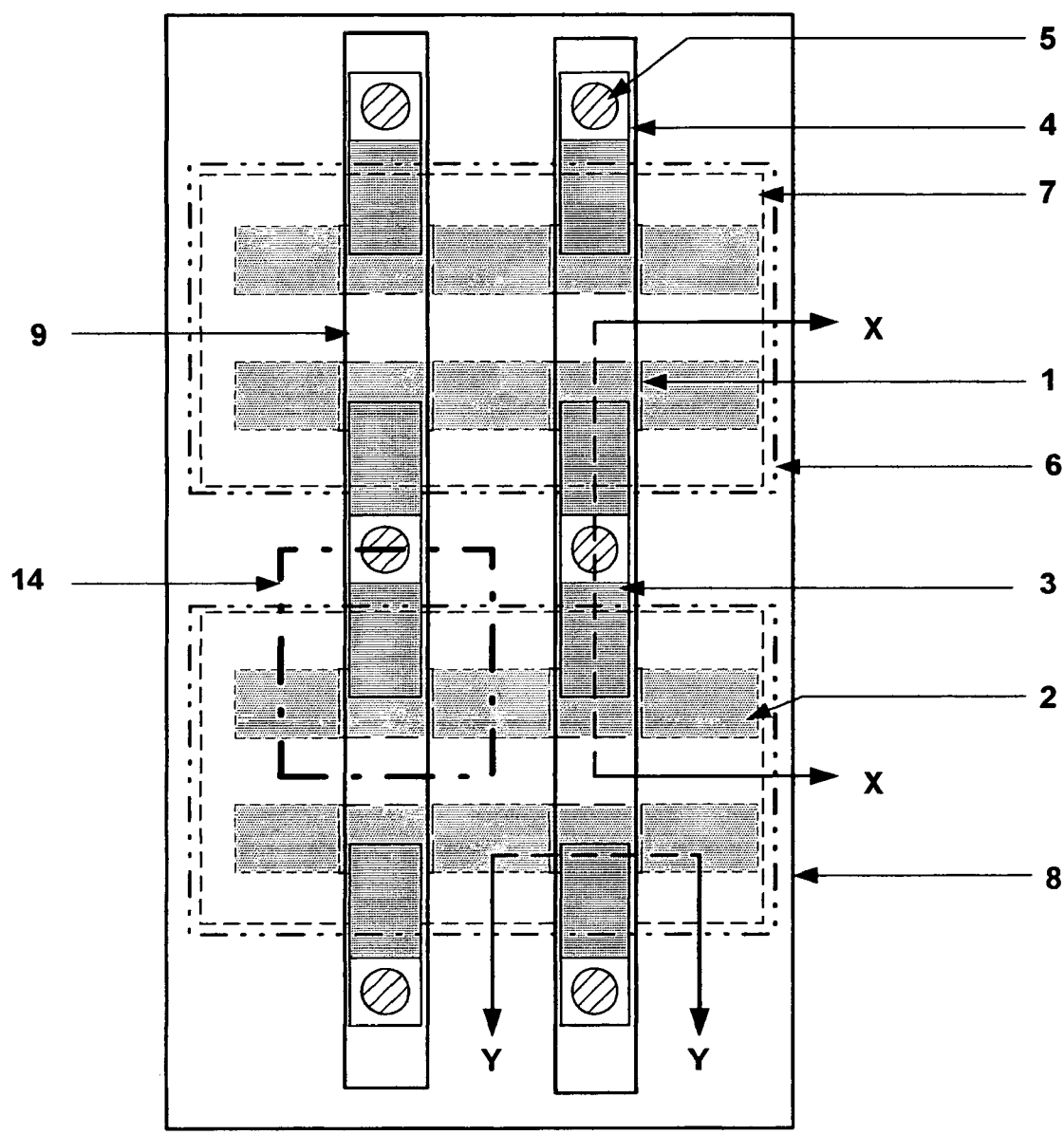
Figure 9:
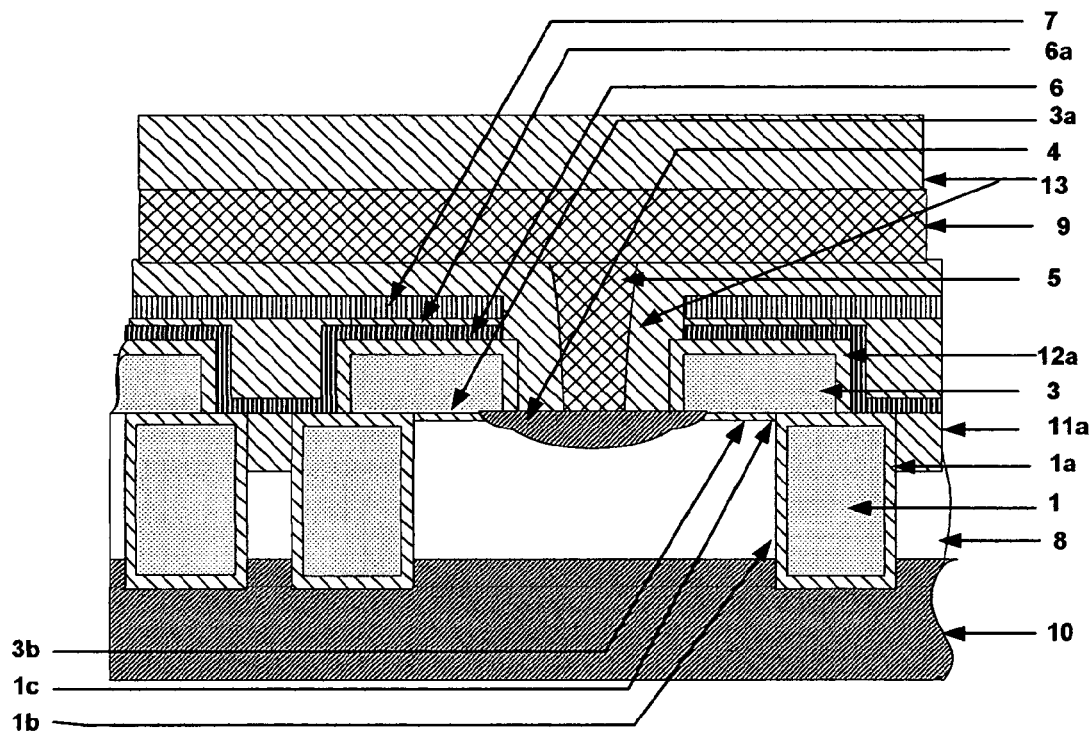
FIG. 9—Is a X—X cross section of CATT2 cell in FIG. 8
FIG. 10—Is a typical operating voltage for the preferred CATT1 cell array.

FIG. 5, FIG. 6, and FIG. 7 show a typical implementation of the proposed cell and technology for high speed, low voltage and low power applications using the combination of the two technologically innovative methods that overcomes the disadvantages of the prior art. FIG. 8 and FIG. 9 with the FIG. 7 show a second typical implementation. These are shown to explain the structure and operation of the technology and is not limiting in that other implementations of the technology are possible, for example with the floating gate implemented inside a trench, on a single side wall or both side walls, with select gate outside, or using a P-channel cell instead of the described n-channel cell by changing the doping of the layers as is well known in the industry. These and other implementations will be known to practitioners of the art and will be covered by the description provided. The technologies that enable this advance are, the Channel Accelerated Carrier Tunneling method and the Tunnel-Gun method, both of which have been patented and the patents are incorporated by reference.

Structure of cell: The typical cell in FIGS. 5, 6 and 7 will be explained with an n-type cell for clarity. This does not limit the technology or the cell being made an n-type using processing that is well known in the industry. The typical cell consists of a Silicon wafer with a p-type doping (not shown) which has a deep well implant with an n-type dopant (10) into which a shallow well implant is done converting the type in the regions where the cell or group of cells forming an array is to be formed to the opposite polarity namely p-type ((8). A shallow trench is cut into the silicon that extends through the shallow well into the deep n-well. A N-type implant may be made optionally into the bottom of the well to enhance the conductivity of the region. The deep well at the bottom of the trench forms a common source contact for the cells in the well. A sidewall oxide is grown in the trench (1a) which will act as the isolation and gate oxide for a vertical select device in the trench. At the same time a surface isolation oxide or field oxide (11) is grown on the silicon to isolate the trench and active regions. The trench itself is then filled with polysilicon (1) that extend over isolation oxide layer (11). This poly is masked and etched to form the select gate poly connection or row select poly connection (2). The polysilicon may be covered by a Polycide or Metal Silicide layer to reduce the series resistance of the select gate/row select. The poly surface is oxidized to form a protective layer of oxide (12). A thin gate oxide or tunnel oxide (3a) active region is now formed on silicon adjacent the trench side wall oxide in a direction perpendicular to the row select polysilicon such that it is isolated from the adjacent active region by isolation oxide or field oxide. A polysilicon layer is now deposited and defined to form a floating gate silicon or floating gate (3) such that it is over the thin gate oxide region and extends over the poly oxide over the trench to overlap the trench side wall/gate oxide edge as shown. The floating gate also extends and covers the thin oxide and extends over the field oxide. Standard LDD process with LDD implant followed by a source/drain implant using an n-type dopant is done to form a doped Drain junction (4) in the shallow p-well. The intersection of the floating gate channel with the select gate channel, in the integrated channel between the substrate/well source at the bottom of the well and the doped drain exist, becomes the discontinuity in the channel (1c) where the carriers have a velocity in the select channel that is directed at the tunnel oxide and the floating polysilicon gate during operation as a CACT device. An oxide layer on the floating gate silicon formed by growing and deposition form the Charge retention oxide (12a). A Tun-Gun structure is now established over the top of the floating gate polysilicon. This is done by deposition of a thin collector grid (6), typically a Metal with high work function like W in the thickness typically less than 60 A-150 A followed by a Barrier material (6a) or oxide typically silicon dioxide or aluminum oxide of 30 to 70 A and an Injector (7) layer which may typically be a thicker layer of metal or doped polysilicon doped to provide the right type of carriers. This sandwich of layers is now masked and etched to form the Tun-Gun. This sandwich of three layers comprising the collector grid (6), the barrier material (6a) and the Injector (7) will be designated and act as the Control gate in normal operation and program using CACT method of the cell and as a ballistic Tunneling Gun (Tun-Gun) providing the carriers for erase during the erase operations as will be explained later. Inter layer dielectric (13), typically silicon dioxide is now deposited over the structure and planarized to provide a level surface for interconnect metalization (9) which is connected to a contact etched to the source diffusion and refilled with conductive material to form the contact refill (5) which makes contact to the diffusion (4), in this case the drain diffusion. This is the structure of a typical CATT1 cell.

In the CATT1 cell the function of the select gate is defined for two adjacent cells. The cells are differentiated by having individual staggered bit line connections as shown in FIG. 1. (alternating connection of the bit line metal to the source contacts). In CATT2 implementation the select gates are for individual cells and it allows the use of a metal bit line (9) per column connected to all the source diffusions in the column as shown in FIG. 8. Both these implementations allow the cell to be in depletion during read operation. If a program using pulsed voltage and verify is used as typical in flash which prevents the cells from over erase and over program, CATT1 cells can be used with single bit line, there by reducing the area of the cell further. This and other modifications to the structure and operation are possible to those who are practitioners of the art and the examples are not intended as limiting the application of the combined methods to any specific implementation.

Operation of the cell: The typical CATT1 cell is used to explain the operation of the cell to erase the cell and to store or write in data and to read out data from the cell. The cells in the typical example are N-channel cells.

Typically the first step is to erase the cells (remove electrons from the floating gate or supply holes to the floating gate to charge it positive) to a fixed positive voltage. This can be done for a byte, row of cells at a time, a block of cells or for the whole array as required using the direct hot carrier injection (in the present case holes) or ballistic injection of holes using the Tun-Gun structure. This operation of generating carriers is similar to the operation of a MIM diode. This is done for the selected cell or cells by application of a differential voltage to the Tun-Gun structure providing a 4.2 V to 5V potential difference across the thin barrier (6a) from the injector (7) to the collector grid (6) and providing an additional fixed voltage difference of approximately a volt between the injector and the Floating gate electrode. Typically the channel formed in the channel region (3b) under the floating gate by application of the coupled down turn on voltage to the floating gate from the collector grid is kept at 0V or a slightly positive potential through the drain diffusion (4) through the bit line (9) and contact fill (5) with the select device in the off condition during this (erase) operation. The necessary voltage to produce hot carriers is provided by applying progressively positive voltages to the grid electrode and the injector electrode. A part of the injected holes that have enough energy to pass through the collector grid without getting absorbed over come the oxide barrier between the collector grid and the floating gate and are collected by the floating gate to charge the gate positive. This collection of holes by the floating gate (Hole mean paths of 400 A have been typically seen in metal) is a self-limiting process depending on the applied voltage on the floating gate. Note that by changing the voltage differential between the floating gate and the collector grid the total charge on the floating gate can be modified. As the efficiency of collection is high the process is fast. By reducing the thickness of the collector grid and optimizing it, a higher charging current can be achieved for fast erase. (By changing the doping of the injector in the Tun-Gun and applying a different polarity of voltage across the TG, electrons can be injected and be made available for collection by the floating gate. This helps to implement alternate types of CATT cells using the same principle used in the CATT1 cells)

The cell or cells are now ready for program (accumulation of negative carriers in the floating gate). Programming is done by selective application of a voltage, typically in the 1 to 1.8V to the drain diffusion (4) through the contact fill (5) and the bit line connection (9), applying sufficient voltage typically of the order of 1 to 1.8V, to turn on the select gate, forming a channel adjacent the oxide in the channel region (1b), and applying a higher voltage, typically 4 to 7V, to control gate. The control gate voltage gets coupled down to the floating gate and turns on the channel in the channel region (3b) adjacent the floating gate. The source which is the deep well is kept at ground potential during program. A discontinuity (1c) exists in the channel where the velocity of carriers, in this case electrons, occur due to change in direction of the combined channel between the source and the drain of the cell. The carriers from the source are accelerated along the select gate channel adjacent the side wall (1) of the trench and acquire a velocity component in the direction of the carrier flow. This velocity component is enhanced by the acceleration in the depletion region existing due to the control gate (6 & 7 together) voltage, which is capacitively coupled down and applied to the floating gate (3) and is directed towards the floating gate as the carriers approach the discontinuity in the channel. This velocity component with the accelerating component will provide enough energy for the carriers to overcome the barrier or tunnel through the barrier into the floating gate using the "Channel Accelerated Carrier tunneling" method and so program the cell. The use of the velocity of the carriers directed at the floating gate oxide at the discontinuity in the channel provide a large volume of carriers having sufficient velocity to be accelerated in the floating gate depletion region to program the cell. Hence the programming efficiency and the speed of programming can be fast, while allowing use of a lower control gate voltage which is sufficient to allow the carriers to over come the gate oxide (3a) barrier separating the channel (3B) from the floating poly-silicon (3). The elimination of the drain voltage, or the use of low control gate voltage (below that needed to cause tunneling or the turning off of the select gate, can all prevent the programming of the cell. It is also to be noted that the programming is self limiting and the total charge in the floating gate can be controlled by the voltage applied to the control gate. (Here again the cells can be made P-channel cells by process steps well known in the industry. These cells will then have the polarity of applied voltages different to attract holes to the floating gate during the CACT process to charge the gate positive.)

Hence by choice of device type and appropriate voltage polarity selections P-type cells can also be programmed and erased using the Tun-Gun and CACT method combination proposed in this disclosure. Since the Tun-Gun method is capable of injecting holes or electrons based on the doping of the injector and the polarity of the applied voltage an N channel cell can be made that is erased by holes injected from the Tun-Gun and programmed by electrons from the channel using CACT method. Similarly a P channel cell can be made that is erased by holes from the channel using CACT method and programmed by electrons from the Tun-Gun method.

The use of the select gate during read operation allow the cells to be insensitive to over-erase and over-program states, unlike the normal flash cell. The cell is also capable of being erased in a bit, byte, page or block level and programmed in a bit, byte or page level. Hence this NOR type cell is very versatile and can be used in applications where the individual prior art NOR or NAND cells where only used.

MultiBit Operation of the Cells: As explained in the cell operation, the erase operation can be controlled and is self limiting based on the voltage difference between the Collector Grid and the Floating gate during the carrier collection. By varying this voltage, while keeping the net differential between the injector and the collector grid same, different amounts of charge can be stored in the floating gate allowing the cell to have multiple thresholds in the erase region.

Similarly by varying the Control gate voltage during programming, there by increasing the coupled down voltage on the floating gate to values above the minimum needed to over come the barrier, the amount of charge accumulation during program can be changed in a manner that is again self limiting depending on the voltage. This will allow multiple levels or thresholds to exist in the program region of the cell.

The fact that both program and erase are self limiting operations allow multiple levels of charge to be stored and hence Vt covering the full band of available Vt shift in the erase and program regions for multi-bit operation.

Standard Array and operation: An array of cells using the CATT1 cell is shown in FIG. 5 and a similar array with CATT2 is shown in FIG. 8.

The CATT1 array (NOR array) has all the sources of all cells connected together through the deep well contact. The select device is common to two two adjacent cells and has the gate poly in the well and running in the row direction connecting all the trenches in a row forming the select line for two adjacent rows of devices adjacent the trench. The control gate of the device is made of the Tunnel Gun stack of two metal layers, the collector grid and the Injector with a barrier in between. These also run in the row direction across the top of the floating gate of all cells in a row. The bit line is a conducting metal line running in the vertical or column direction and connecting to the staggered drain contacts of adjacent cells from two different rows as shown in FIG. 5.

The voltages applied to each of the connections in a typical CATT1 during erase, program and read applications are shown in FIG. 10.

Cell size: One of the problems with the prior art flash memory is that the cells cannot be scaled effectively. This is due to multiple considerations. The lateral scaling is limited by the need for the contacts and also the spacing between devices needed to achieve high voltage isolation. Typical cell size is between 8 and 12 f^2, where f is the minimum feature size.

The current technology that uses the combination of novel methods for program and erase can substantially reduce the size of the cell due to use of lower voltages for erase and program. Even the medium voltages used are only applied to the gates and not to the junctions of the devices eliminating any high voltage breakdown issues of the junctions.

The reduced high voltage requirement reduces the peripheral complexity of the circuits needed to program and erase the memory cells and the peripheral area of the chip designed using this disclosed technology.

A typical cell size is shown in FIG. 5 for the CATT1 cell and FIG. 8 for the CATT2 cell.

The Advantages and Disadvantages of the Invention:

The advantages of the proposed CATT cells using the combination of Tun-Gun method and the CACT methods for charging and discharging the cells are:
1. Low voltage operation.
2. The medium program erase voltages, where they are used are only applied to the elements in the control gate of the devices.
3. No cell drain engineering is needed.
4. Cell can be implemented as a P or N device—only changes will be in the Tun-gun materials and the applied voltage polarities for operation, which are well established in the industry.
5. No new process technology development is needed, standard process steps used for cell.
6. Low power operation due to lower voltage and currents from pump circuits during program and erase.
7. Low voltage devices in the data path allow high speed access to data.
8. High efficiency erase and programming schemes using reduced currents.
9. High speed erase and program operations possible.
10. High density memory possible—cell sizes 6 to 8 f0̂2.
11. Can be configured for Bit, Byte or Page mode operation.
12. Versatile cell capable of performing in a page mode flash environment for bulk storage as the cell provides:
   a. Small foot print similar to NAND and
   b. High density due to close packing capability
   c. Fast Program and erase for photo applications.
   d. Fast data access.

What is claimed is:

1. Non-Volatile memory cell that is erased by one type of carriers using either one of the two methods, one being Tunnel-Gun (Tun-Gun) method, the second being the Channel Accelerated Carrier Tunneling (CACT) method, and programmed by opposing type of carriers using alternate method from that used for erase.

2. The Non-Volatile memory cell that is erased by one of two methods and programmed by the other, in claim 1, wherein, the cell is an N-Channel memory cell.

3. The Non-Volatile memory cell that is erased by one of two methods and programmed by the other, in claim 1, wherein the memory is a P-Channel memory.

4. The Non-Volatile memory cell that is erased by one of two methods and programmed by the other, in claim 1, where in, the self limiting feature of the CACT and Tun-Gun injection process allow efficient multi-bit storage capability.

5. A Non-Volatile memory cell that is Erased by one type of carriers using the Tun-Gun method and Programmed by opposing type of carriers using the CACT method.

6. The Non-Volatile memory cell that is erased by one type of carriers using the Tun-Gun method and Programmed by opposing type of camers using the CACT method in claim 5, where in, the cell is a N-Channel cell and the programming is by injection of electrons into the floating gate.

7. The Non-Volatile memory cell that is erased by one type of carriers using the Tun-Gun method and Programmed by opposing type of carriers using the CACT method in claim 5, where in, the cell is a P-Channel cell and the programming is by injection of holes into the floating gate.

8. The Non-Volatile memory cell that is erased by one type of carriers using the Tun-Gun method and Programmed by opposing type of carriers using the CACT method in claim 5, where in, the cell is a N-Channel cell and it is erased by injection of holes into the floating gate.

9. The Non-Volatile memory cell that is erased by one type of carriers using the Tun-Gun method and Programmed by opposing type of carriers using the CACT method in claim 5, where in, the cell is a P-Channel cell and it is erased by injection of electrons into the floating gate.

10. A Non-Volatile memory cell that is Erased by one type of carriers using the CACT method and Programmed by opposing type of carriers using the Tun-Gun method.

11. The Non-Volatile memory cell that is erased by one type of carriers using the CACT method and Programmed by opposing type of carriers using the Tun-Gun method in claim 10, where in, the cell is a N-Channel cell and the programming is by injection of holes into the floating gate.

12. The Non-Volatile memory cell that is erased by one type of carriers using the CACT method and Programmed by opposing type of carriers using the Tun-Gun method in claim 10, where in, the cell is a P-Channel cell and the programming is by injection of electrons into the floating gate.

13. The Non-Volatile memory cell that is erased by one type of carriers using the CACT method and Programmed by opposing type of carriers using the Tun-Gun method in claim 10, where in, the cell is a N-Channel cell and is erased by injection of electrons into the floating gate.

14. The Non-Volatile memory cell that is erased by one type of carriers using the CACT method and Programmed by opposing type of carriers using the Tun-Gun method in claim 10, where in, the cell is a P-Channel cell and is erased by injection of holes into the floating gate.

* * * * *